United States Patent
Demirlioglu

[11] Patent Number: 6,063,704
[45] Date of Patent: May 16, 2000

[54] PROCESS FOR INCORPORATING SILICON OXYNITRIDE DARC LAYER INTO FORMATION OF SILICIDE POLYSILICON CONTACT

[75] Inventor: Esin K. Demirlioglu, Cupertino, Calif.

[73] Assignee: National Semiconductor Corporation, Santa Clara, Calif.

[21] Appl. No.: 09/366,033

[22] Filed: Aug. 2, 1999

[51] Int. Cl.[7] .......................... H01L 21/44; H01L 21/4763
[52] U.S. Cl. .......................... 438/664; 438/655; 438/592; 438/636; 438/682; 438/786
[58] Field of Search ..................... 438/592, 786, 438/636, 651, 655, 664, 682, 630, 683, 685

[56] References Cited

U.S. PATENT DOCUMENTS 5,580,701  12/1996  Lur et al. .................................. 430/316
5,904,564   5/1999  Park ......................................... 438/655
5,956,584   9/1999  Wu ........................................... 438/664

OTHER PUBLICATIONS

Chen, I., et al., "Microelectronic Device and Multilevel Inerconnection Technology II", SPIE vol. 2875, pp. 188–200 (1996).

Maa, J., et al., "Reaction of Amorphous Silicon with Cobalt and Nickel Silicides Before Disilicide Formation", Materials Research Society, Symp. Proc. vol. 402, pp. 185–190, (1996).

Osburn, C.M., et al., "Metal Silicides: Active Elements of ULSI Contacts", Journal of Electronic Materials, vol. 25, No. 11, pp. 1725–1739 (1996).

Sakai, I., et al., "A New Salicide Process (PASET) for Sub–half Micron CMOS", Symposium on VLSI Technology Digest of Technical Papers, pp. 66–67, (1992).

Wu, J., et al., "Comparing Inorganic and Organic BARC for a Deep Sub–Micron Gate Patterning & Etch", Proc. SPIE Vo. 3332, pp. 696–709, (1998).

*Primary Examiner*—Charles Bowers
*Assistant Examiner*—Hsien-Ming Lee
*Attorney, Agent, or Firm*—Limbach & Limbach L.L.P.

[57] ABSTRACT

A process flow for forming a silicided polysilicon feature avoids removal of the SiON dielectric anti-reflective coating (DARC) used to pattern the polysilicon. Instead, following polysilicon formation and etching aided by the DARC, the DARC is modified to enrich its silicon content. This modification may take the form of densification by annealing in conjunction with formation of a seal oxide, densification by annealing in an inert ambient prior to exposure to oxidizing conditions, or direct ion implantation of semiconductor material into the DARC. As a result of this modification, the DARC becomes sufficiently enriched in semiconductor material to permit formation of silicide. Thermal densification of DARC during formation of a seal oxide is sufficient to permit formation of silicide upon exposure to a silicide-forming metal. In this embodiment however, implantation of semiconductor material prior to silicide formation is generally necessary to permit silicidation of a thin oxide layer created between DARC and polysilicon as a by-product of the prior thermal seal oxidation step.

20 Claims, 7 Drawing Sheets

PROCESS FOR INCORPORATING SILICON OXYNITRIDE DARC LAYER INTO FORMATION OF SILICIDE POLYSILICON CONTACT

BACKGROUND OF THE INVENTION

1. Field of the Invention

The present invention relates to a process for incorporating an anti-reflective coating into a CMOS process flow, and in particular, to a process which avoids having to remove a DARC film prior to formation of a silicided contact.

2. Description of the Related Art

Continued reduction in the feature size of integrated circuits requires stringent control over critical dimensions throughout the photolithographic process. Anti-reflective coatings (ARC) are widely used to enhance control over critical dimension by minimizing reflections from the layer sought to be patterned. These anti-reflective coatings include top or bottom organic spin-on materials (BARC) and inorganic dielectric materials (DARC).

BARC materials are organic in composition and are readily selectively etched during resist clean processes that follow the patterning process. However, DARC material is typically inorganic in composition, and must therefore be removed with a different chemistry or remain in place as a dielectric.

When used in patterning a gate structure in a CMOS process flow, DARC is generally required to be removed because its presence interferes with subsequent formation of a low-resistance silicided contact with the polysilicon gate. Unfortunately however, removal of DARC material is difficult and introduces a number of problems. These problems are illustrated in FIGS. 1A–1G, FIGS. 2A–2E, and FIGS. 3A–3E below.

FIGS. 1A–1G show a cross-sectional view of the process steps of a first conventional process flow for forming a CMOS device. FIG. 1A shows the starting point for the process, wherein thin gate oxide 100 is formed over single crystal silicon 102. Polysilicon layer 104 is then formed over gate oxide 100, and etch stop oxide layer 106 is then deposited or grown over the polysilicon layer 104. DARC 108 (typically $Si_3N_4$ or SiON) is then formed over etch stop oxide layer 106. Photoresist 110 is then spun. The presence of an additional footer oxide layer 112 beneath photoresist 110 may be necessary to promote adhesion of photoresist 110 to the underlying DARC 108.

Photoresist 110 is patterned during exposure and develop steps. The thickness of layers 108, 110, 106, and 112 are tailored to minimize reflections from polysilicon layer 104 at the wavelength of light utilized during this exposure step.

FIG. 1B shows the next step in the conventional process, wherein using photoresist 110 as a mask, the pattern of the photoresist is transferred to polysilicon layer 104 by etching footer oxide 112, DARC 108, etch stop oxide 106, polysilicon layer 104, and gate oxide 100 in unmasked regions. Photoresist 110 is then stripped.

FIG. 1C shows formation of seal oxide layer 114 by exposing the resulting surface to heat (between around 700–1000° C.) in the presence of an oxidizing ambient. As a result of this oxidation, seal oxide 114a grows over exposed single crystal silicon regions 102 and sidewalls 104a of polysilicon 104. Seal oxide 114b having approximately half the thickness of seal oxide 114a forms over DARC 108. Exposing DARC 108 to heating during this step serves to densify the DARC, enriching it in silicon.

FIG. 1D shows the next step in the conventional process flow, wherein seal oxide layer 114 is exposed to wet etchant (typically dilute HF). This step removes all of seal oxide 114b formed over DARC 108, and approximately one-half of seal oxide 114a formed over silicon regions 102 and 104.

FIG. 1E shows removal of the now-exposed DARC layer 108 by exposure to wet etchant such as hot phosphoric acid, or to dry etchant having a high selectivity relative to etch stop oxide layer 106. Unless the seal oxide layer 114 is of sufficient thickness (>4 nm), overetching can occur during this step, damaging the surface of the single crystal silicon 102 that will later form source and drain regions.

FIG. 1F shows the subsequent implantation of dopant of a first conductivity type into single crystal silicon regions 102, masked by polysilicon 104. This forms lightly-doped drain (LDD) regions 124 aligned to polysilicon 104.

Following an optional thermal diffusion of LDD regions 124 underneath polysilicon gate 104, FIG. 1G shows completion of fabrication of the MOS device by formation of gate spacers 116 along polysilicon sidewalls 104a, implantation of dopant of the first conductivity type to form source/drain regions 118, and removal of etch stop layer 106 and seal oxide 114a. Silicided contacts 120 are then formed on polysilicon gate 104 and source/drain regions 118.

While the process depicted above in FIGS. 1A–1G is sufficient to form a MOS transistor device, this process flow suffers from an important disadvantage. Specifically, unless seal oxide 114 is formed having a thickness adequate to block etchant employed in removing DARC 108, insufficient etch selectivity can result in degradation of the precursor MOS structure during DARC removal. Specifically, overetching during the step shown in FIG. 1E can damage fragile single crystal silicon regions that will later form the source and drain. This is a serious problem if the prescribed feature size requires formation of a seal oxide having a thickness of less than 4 nm.

FIGS. 2A–2E show an alternative conventional process for forming a MOS transistor, in which the DARC is removed during the gate spacer etchback process. The process steps leading up to FIG. 2A are the same as FIGS. 1A–1D shown above.

FIG. 2A shows that rather than etching DARC 108 immediately following removal of overlying thin seal oxide layer 114b, the alternative conventional process performs ion-implantation of dopant of the first conductivity type through remaining seal oxide 114a to form LDD regions 124 aligned to polysilicon gate 104 and the vertical edges of seal oxide 114.

Following an optional thermal diffusion of LDD regions underneath polysilicon gate 104, FIG. 2B shows formation of a spacer dielectric layer 126 over seal oxide 114a, and the polysilicon gate including DARC 108. Spacer dielectric layer 126 may be formed from silicon nitride, or a stack composed of silicon nitride on silicon oxide. Spacer dielectric layer 126 conforms to polysilicon gate 104, becoming vertical along gate sidewalls 104a.

FIG. 2C shows anisotropic etching of conformal spacer dielectric layer 126 to produce sidewall spacers 116 along sidewalls 104a of gate structure 104. DARC 108 previously densified during the seal oxidation step is also removed during this step by the same etchant used to remove the spacer material.

FIG. 2D shows the formation of source/drain regions 118 through implantation of dopant of the first conductivity type and annealing. Subsequent removal of etch stop layer 106 and seal oxide layer 114a exposes surfaces of gate 104 and source/drain 118 prior to formation of silicide contacts. FIG. 2E shows completion of fabrication of the MOS device by formation of silicided contacts 120 to gate 104 and to source/drain regions 118.

Again, while the conventional process depicted above in FIGS. 2A–2E is sufficient to form a MOS transistor device, this process flow also suffers from important disadvantages. Specifically, insufficient etch selectivity of DARC 108 and spacer nitride layer 126 relative to etch stop layer 106 and seal oxide layer 114a shown in FIG. 2C may result in overetching and damage to precursor source/drain single crystal silicon regions.

Moreover, removal of the DARC layer during spacer etchback is not compatible with formation of spacers consisting of a stack of dielectric layers, such as the oxide/nitride spacers commonly employed to form MOS transistors. This is because the oxide layer of the spacer stack will act as an etch barrier during etchback of the nitride spacer layer, leaving the underlying DARC layer intact.

FIGS. 3A–3E show yet another alternative conventional process for forming a MOS transistor. The process steps leading up to FIG. 2A are the same as FIGS. 1A–1D shown above.

FIG. 3A shows ion-implantation of dopant of a first conductivity type through seal oxide 114 to form LDD regions 124 aligned to polysilicon gate 104 and the vertical edges of seal oxide 114.

FIG. 3B shows formation of a spacer dielectric layer 126 over seal oxide 114. Rather than being formed from silicon nitride or a silicon nitride/oxide stack as shown in prior FIG. 2B, spacer dielectric layer 126 is formed from silicon oxide. Spacer dielectric layer 126 conforms to polysilicon gate 104, becoming vertical along gate sidewalls 104a.

FIG. 3C shows anisotropic etching of conformal spacer dielectric layer 126 to produce sidewall spacers 116 along sidewalls 104a of gate structure 104. During this step, varying amounts of seal oxide 114 overlying single crystal regions 102 may also be etched. Unlike in FIG. 2C above, DARC 108 remains substantially unaffected by this etching step.

FIG. 3D shows specific etching of DARC 108 to stop on underlying oxide etch stop layer 106. Employing an etch having insufficient selectivity relative to oxide can also result in the removal of seal oxide layer 114a, exposing single crystal silicon regions 102 to damage during this step. This problem is exacerbated by prior uneven removal of the seal oxide 114 which serves as an etch stop during this step, due to overetching of the spacer oxide layer 126 during the previous step.

FIG. 3E shows completion of fabrication of the MOS device by implantation of dopant of the first conductivity type to form source/drain regions 118, removal of any remaining seal oxide 114a, and formation of silicided contacts 120 to gate 104 and source/drain regions 118.

Again, while the process depicted above in FIGS. 3A–3E is sufficient to form a MOS transistor device, this process flow can also damage the device. Specifically, insufficient etch selectivity during the step shown in FIG. 3D may result in overetching and damage to precursor single crystal silicon source/drain regions. This is partly due to the fact that the spacer etchback step shown in FIG. 3C may actually leave oxide of varying thicknesses over the device.

Given the difficulties of conventional process flows requiring removal of DARC material during formation of silicided contacts, there is a need in the art for a CMOS process which avoids removal of the DARC coating over polysilicon prior to formation of silicided contacts.

SUMMARY OF THE INVENTION

A process flow for forming a silicided polysilicon structure of a MOS device avoids removal of the silicon oxynitride (SiON) dielectric anti-reflective coating (DARC) used to pattern the polysilicon gate. After polysilicon formation and etching assisted by the SiON DARC, the DARC is modified to enhance its semiconductor content. As a result of this modification, the DARC material becomes sufficiently enriched in semiconducting material to allow subsequent formation of a silicide contact upon annealing in the presence of a silicide-forming metal.

A process flow for forming a polysilicon feature having a silicided contact in accordance with one embodiment of the present invention comprises the steps of forming a polysilicon layer, forming a layer of DARC having a semiconductor content over the polysilicon layer, and patterning a photoresist mask over the DARC. The DARC and the polysilicon layer are etched in unmasked regions. The DARC is modified to enhance its silicon content. Finally, the modified DARC is exposed to a silicide-forming metal, such that the densified DARC is converted into silicide.

A method of forming a silicided contact to a polysilicon feature comprises the steps of patterning a precursor gate structure from a polysilicon layer bearing a DARC having a semiconductor content, modifying the DARC to enhance its semiconductor content, and annealing the modified DARC while in contact with a silicide-forming metal to form a silicide.

The features and advantages of the present invention will be understood upon consideration of the following detailed description of the invention and the accompanying drawings.

DETAILED DESCRIPTION

A process flow for forming a silicided gate structure of a MOS device avoids removing the silicon oxynitride (SiON) dielectric anti-reflective coating (DARC) used to pattern the polysilicon. Instead, after polysilicon formation and etching aided by the DARC, the DARC is densified by heating. As a result of this densification, the DARC material becomes sufficiently enriched in silicon and depleted in hydrogen to react with a silicide-forming metal and form silicide during subsequent annealing steps.

Figure 1A:
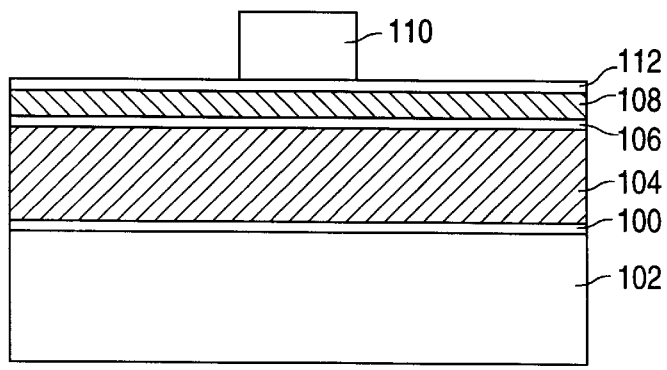
FIGS. 1A–1G show cross-sectional views of a first conventional process flow for forming a polysilicon gate structure utilizing DARC.
Figure 1B:
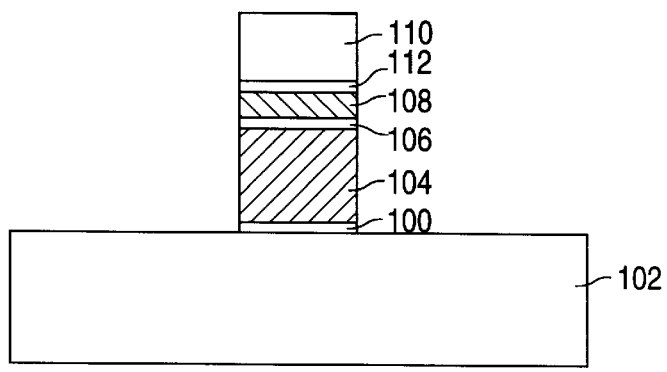
Figure 1C:
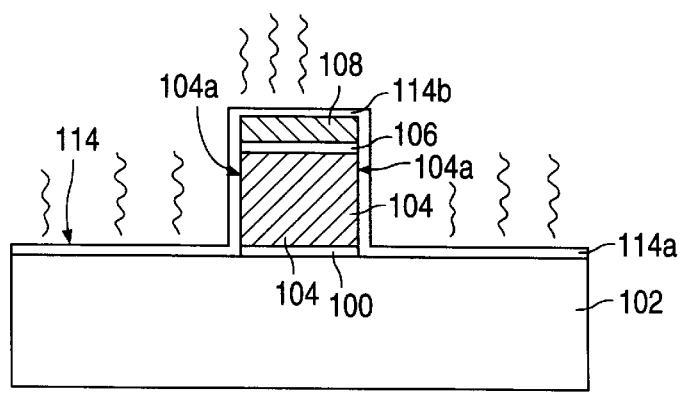
Figure 1D:
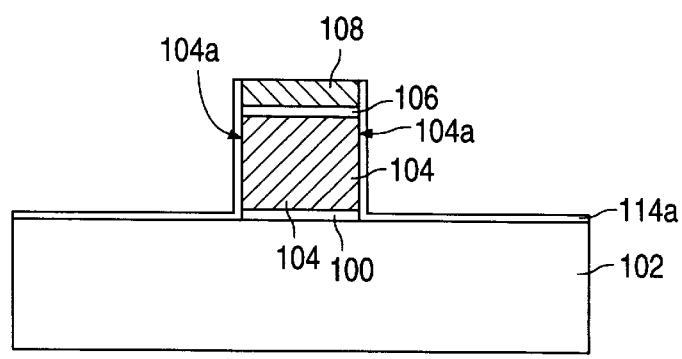
Figure 1E:
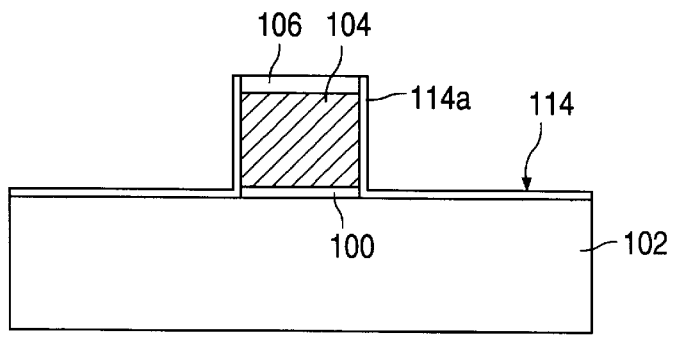
Figure 1F:
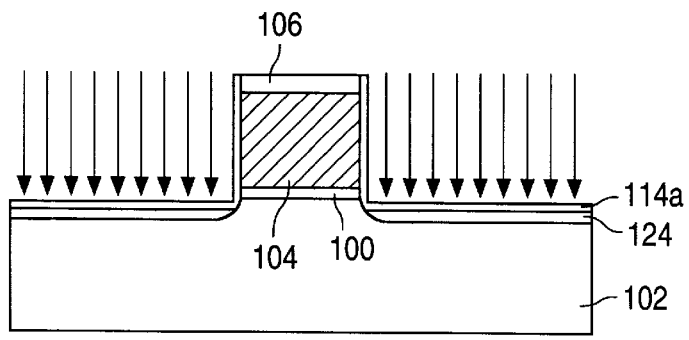
Figure 1G:
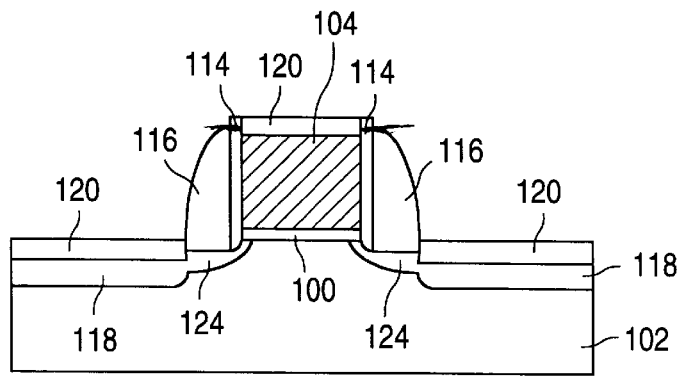
Figure 2A:
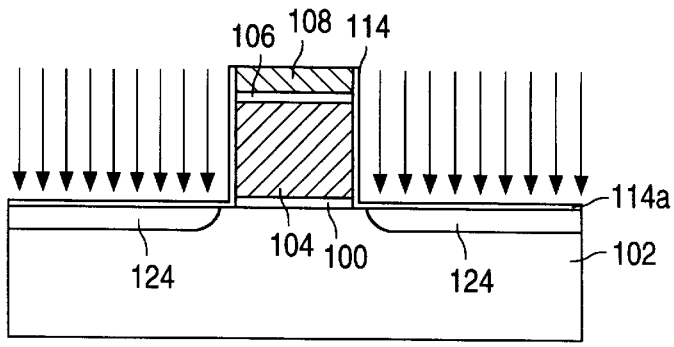
FIGS. 2A–2E show cross-sectional views of an alternative conventional process flow for forming a polysilicon gate structure utilizing DARC.
Figure 2B:
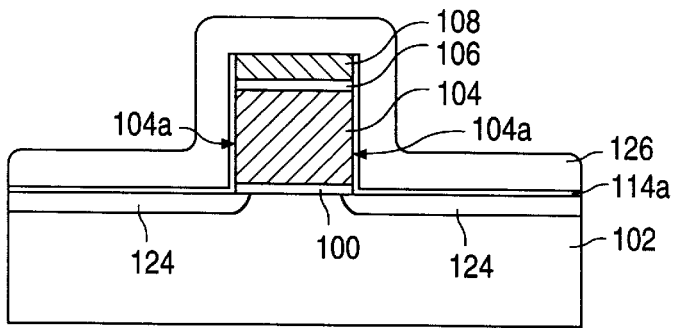
Figure 2C:
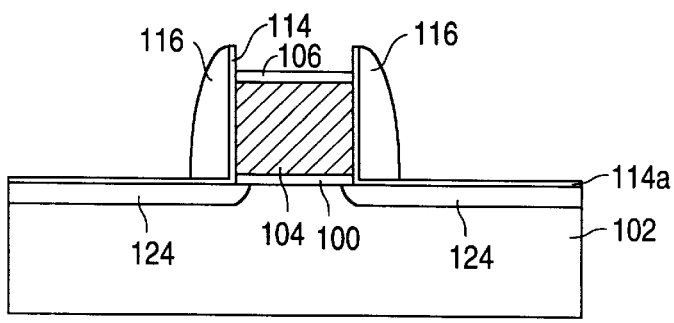
Figure 2D:
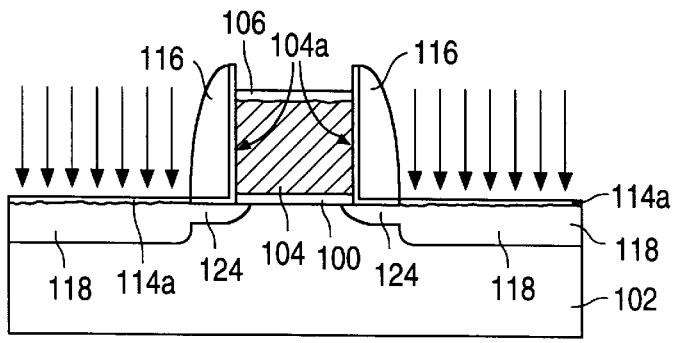
Figure 2E:
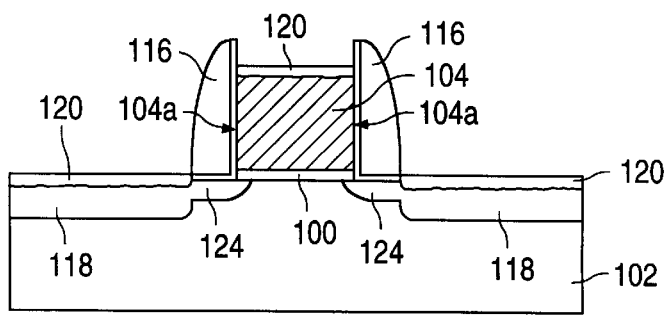
Figure 3A:
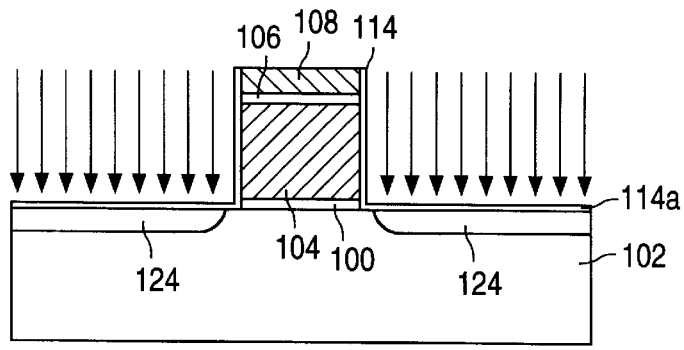
FIGS. 3A–3E show cross-sectional views of yet another alternative conventional process flow for forming a polysilicon gate structure utilizing DARC.
Figure 3B:
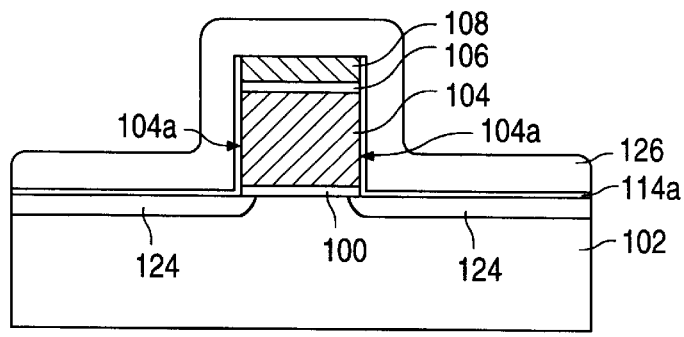
Figure 3C:
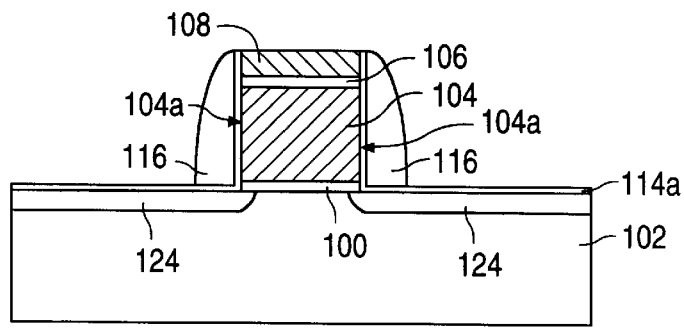
Figure 3D:
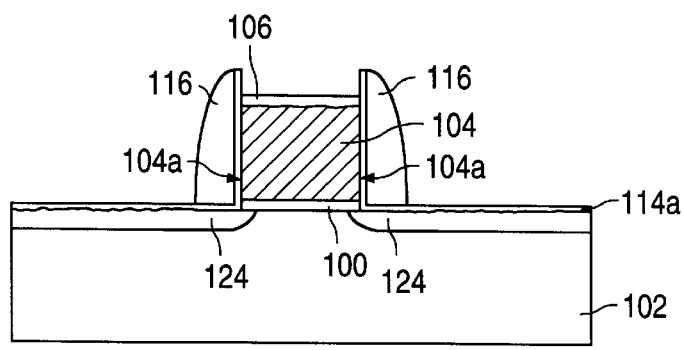
Figure 3E:
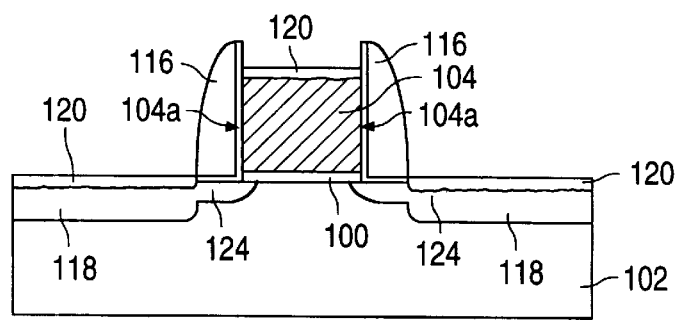
Figure 4A:
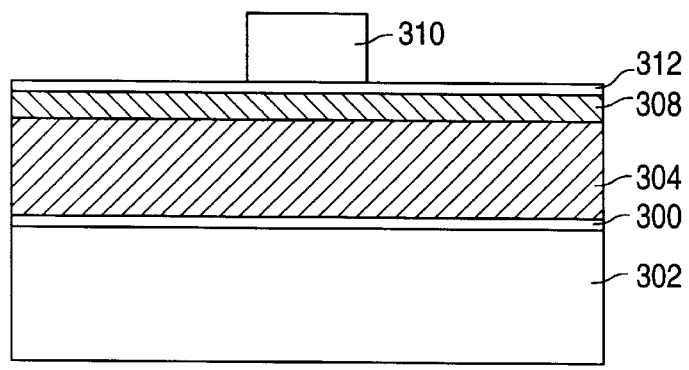
FIGS. 4A–4I show cross-sectional views of the process flow for forming a polysilicon gate structure incorporating DARC in accordance with one embodiment of the present invention.

FIGS. 4A–4I show cross-sectional views of the process flow in accordance with one embodiment of the present invention. FIG. 4A shows the starting point for the process, wherein a thin gate oxide 300 is formed over single crystal silicon 302. Polysilicon layer 304 is then formed over gate oxide 300. SiON DARC 308 is then formed over polysilicon layer 304.

SiON DARC layer 308 can be formed by a number of different techniques, including deposition of SiON in an ambient containing $O_2$, NO, $N_2O$, $NH_3$, He, $N_2$, or Ar. Alternatively, SiON can be formed by exposure of polysilicon 306 to an ambient containing NO, $N_2O$, or $NH_3$, in dilution with $O_2$, $N_2$, or Ar.

Photoresist 310 is then spun over DARC 308. Deposition of an additional thin layer of footer oxide 312 prior to the formation of photoresist 310 may be necessary to promote adhesion between photoresist 310 and underlying DARC 308.

Photoresist 310 is then patterned during exposure and develop steps. The thickness of layers 308, 310, and 312 are tailored to minimize reflections from polysilicon layer 304 at the wavelength of light utilized during this exposure step.

Figure 4B:
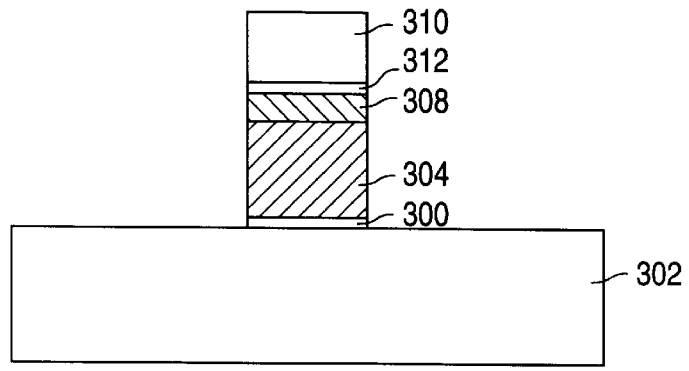

FIG. 4B shows the next step in the process, wherein using photoresist 310 as a mask, the pattern of photoresist is transferred to polysilicon layer 304 by etching footer oxide 312, DARC 308, polysilicon layer 304, and gate oxide 300 in unmasked regions. Photoresist 310 is then stripped.

Figure 4C:
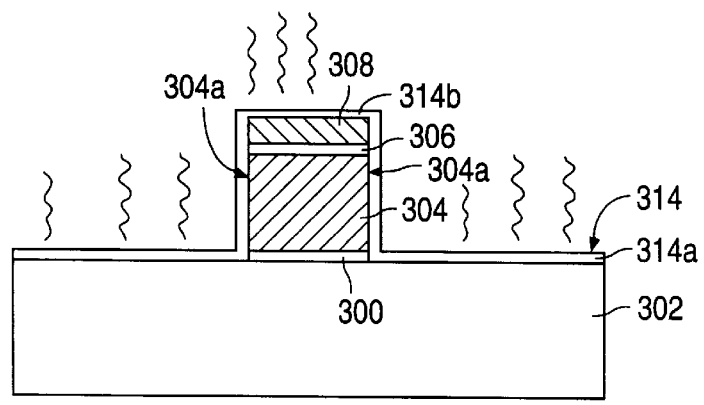

FIG. 4C shows formation of seal oxide layer 314 by heating the resulting surface in an oxidizing ambient. As a result of this oxidation, seal oxide 314a is grown on sidewalls 304a of polysilicon 304, and over the exposed single crystal silicon regions 302. Seal oxide 114b having approximately half the thickness of seal oxide 114a forms over DARC 308.

As a result of the heating that accompanies the formation of seal oxide 314, DARC 308 undergoes a reaction that changes its chemical composition. TABLE A shows the change in DARC composition revealed by Rutherford Backscattering Spectrometry (RBS) of one SiON DARC sample:

TABLE A

Composition of SiON DARC Films

| PROCESS STAGE | % Si | % O | % N | % H |
|---|---|---|---|---|
| As Formed | 50% | 36% | 5% | 9% |
| Following Poly Seal/Densification | 57% | 31% | 11% | ≈0% |

The enhanced silicon content (>55%) of the densified DARC film permits silicide to be formed upon annealing in contact with a silicide forming metal.

Unfortunately however, one by-product of heating during the seal oxidation process is formation of a thin oxide layer 306 between the silicided DARC 320 and the unsilicided polysilicon 304. Thin oxide layer 306 is the result of reaction between polysilicon 304 and oxygen which diffuses through DARC 308 during the poly seal oxidation step.

Figure 4D:
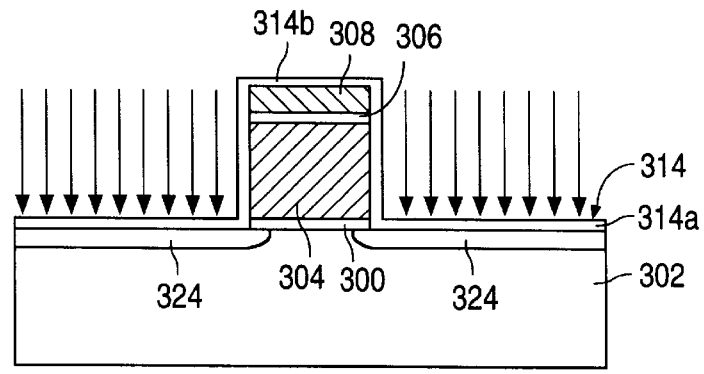
Figure 4E:
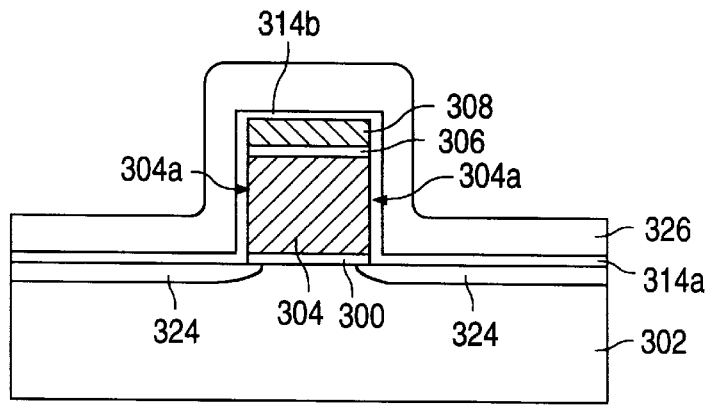

FIG. 4D shows ion-implantation of conductivity-altering dopant through seal oxide 314 to form LDD regions 324 aligned to polysilicon gate 304. Following an optional thermal diffusion of LDD regions 324 underneath polysilicon gate 304, FIG. 4E shows formation of a spacer dielectric layer 326 over seal oxide 314. Spacer dielectric layer 326 may be formed from silicon nitride or silicon oxide. Spacer dielectric layer conforms to polysilicon gate 304, becoming vertical along gate sidewalls 304a.

Figure 4F:
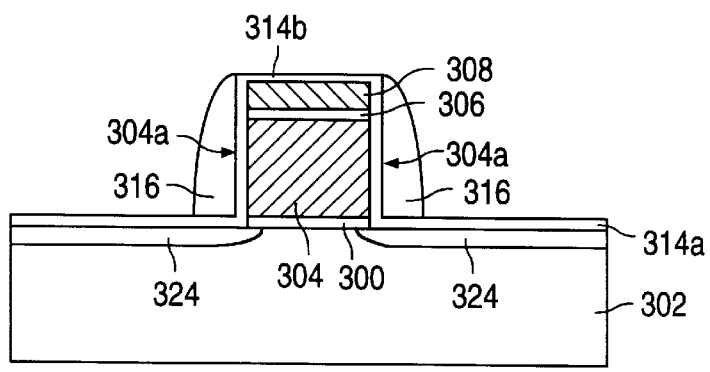

FIG. 4F shows anisotropic etching of conformal spacer dielectric layer 326 to produce sidewall spacers 316 along sidewalls 304a of gate structure 304. Unlike the conventional process, densified DARC 308 is left undisturbed by this etching.

Figure 4G:
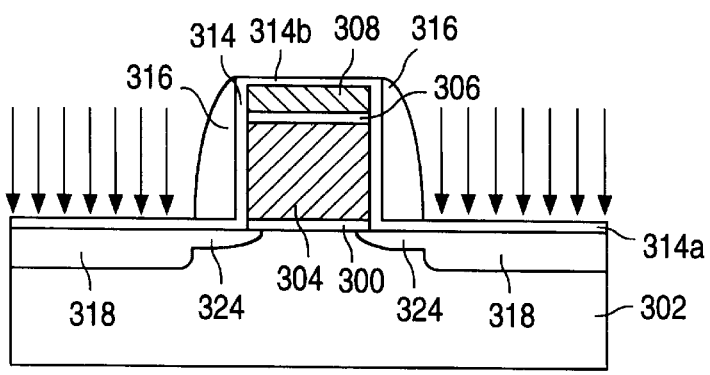

FIG. 4G shows implantation of high doses of conductivity altering dopant aligned by polysilicon gate 304 and sidewall spacers 316 to form source/drain regions 318. Damage to the surface of single crystal silicon 302 resulting from this implant step is lessened by the presence of overlying seal oxide layer 314a.

Figure 4H:
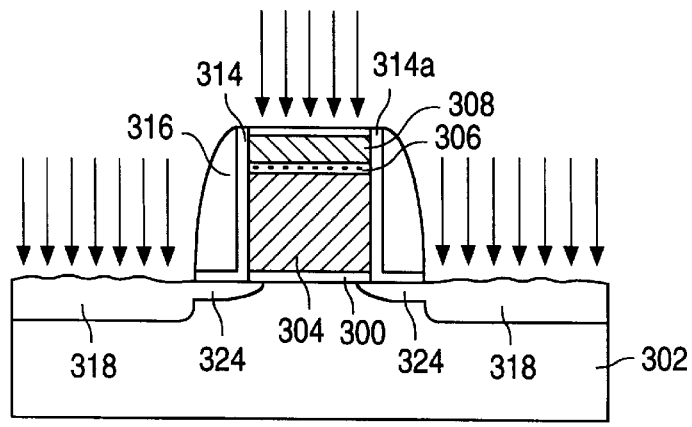

FIG. 4H shows the pre-silicide etch which selectively removes remaining seal oxide layer 314a. Semiconductor material (either Si or Ge) is then blanket implanted into the entire surface, including into densified DARC 308. The purpose of this implant is to increase the concentration of semiconductor material in thin oxide layer 306, thereby providing seed material for subsequent formation of silicide in this region to create a conductive path throughout the entire gate structure.

Implantation of semiconductor material during this step is performed such that the projected implant range and the straggle equal the thickness of the DARC 308, with the tail of the implant lying within polysilicon 304. The dose of the semiconductor implants can be determined by requiring semiconductor material concentration (either Si, or native Si and implanted Ge) to be at least 55% in the underlying thin oxide. A typical set of process parameters is shown in TABLE B:

TABLE B

| PROCESS PARAMETER | VALUE |
|---|---|
| DARC film thickness | 20 nm |
| distribution of implanted semiconductor material | assumed gaussian |
| dose of implanted Si | $7.2 \times 10^{15}$ atoms/cm$^2$ |
| energy of implanted Si | 10 keV |
| dose of implanted Ge | $5.4 \times 10^{15}$ atoms/cm$^2$ |
| energy of implanted Ge | 20 keV |

Because the implant of semiconductor material is not masked, the high dose of the semiconductor implants also have the effect of amorphizing the silicon in other regions receiving the implant. As shown in FIG. 4H, affected silicon regions include source/drain 318 of the MOS device. However, this amorphous silicon will be entirely consumed during the silicidation process, and thus should not cause extra leakage or high resistivity in source/drain regions of the MOS device that is formed.

Figure 4I:
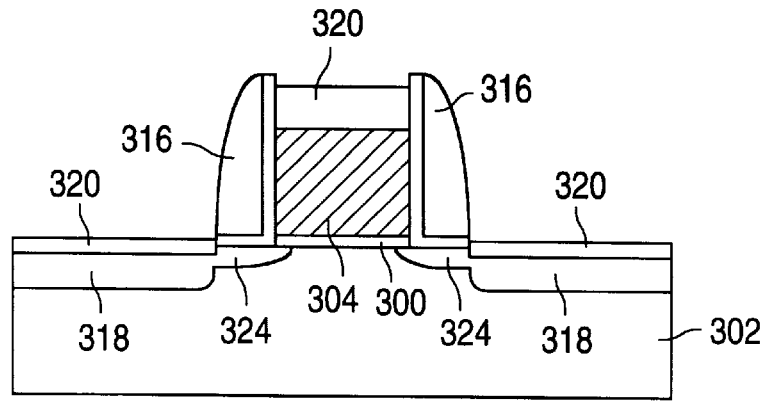

FIG. 4I shows completion of the transistor structure, with formation of silicided contacts 320 to gate 304 and drain/source regions 318 of the transistor. This is done by forming a layer of a silicide-forming metal over the doped silicon regions, and then annealing the silicon/metal junction to create silicide.

After densified DARC films were subjected to source/drain implant and high temperature annealing followed by silicidation, the densified DARC films exhibited sheet resistances ($R_s$) of 7.5Ω/□ for n-type implants, and 2.8Ω/□ for p-type implants. These sheet resistances are ideal for silicide contacts.

The role of densifying the SiON DARC prior to silicide formation in accordance with the present invention is illustrated in TABLE C, which compares sheet resistances of silicided polysilicon features with and without the DARC densification step:

TABLE C

Effect of Densification on Polysilicon Contact

| DARC Form | % Si | % O | $R_s$ ($\Omega/\square$) |
|---|---|---|---|
| DARC As Created | 51.5% | 37% | 237 ± 41 |
| Densified DARC | 57% | 31% | 7.39 ± 3.66 |

Concentrations of the samples listed above in TABLE C above were determined by RBS following the seal oxide, where the relative concentration of Nitrogen was determined to be 11% for both samples. The sheet resistances were measured following an n-type implant of As with a dose of $4.5 \times 10^{15}$ atoms/cm$^2$ at an energy of 50 keV. The samples received an anneal at 1050° C. in $N_2$ and were etched in 10:1 HF prior to silicidation.

The process flow in accordance with the present invention offers a number of important advantages over conventional processes. One key advantage of the present invention is that the SiON DARC material used to pattern the polysilicon gate is altered, rather than removed, during the process flow. This obviates the need to remove the DARC material, which as described above can cause damage to the underlying sensitive underlying single crystal silicon source/drain regions. Removal of the DARC also typically introduces added process complexity in the form of additional steps utilizing a second etch chemistry.

Another advantage of the present invention is its ready integration into existing process flows. Specifically, the step of densifying the DARC material naturally occurs during the thermal seal oxidation step already used to minimize implant damage to the single crystal silicon and protect the sidewalls of the polysilicon gate. Moreover, because implantation of semiconductor material into the thin oxide is unmasked, this step does not require additional masking steps.

A further advantage of the present invention is improvement in the silicidation of narrow lines. Researchers have discovered that the presence of amorphous silicon can enhance the formation of silicide, especially in narrow conducting line regions. See C. Osburn, et al., "Metal Silicides: Active Elements of ULSI Contacts", Journal of Electronic Materials, Vol. 25, No. 11 (1996), p. 1733. Accordingly, concurrent with blanket implantation of semiconductor material into the thin oxide beneath the DARC in accordance with the present invention, semiconductor material can be implanted into precursor line regions to create amorphous silicon in preparation for the formation of silicides.

Although the invention has been described in connection with one specific preferred embodiment, it must be understood that the invention as claimed should not be limited to this particular embodiment. Various other modifications and alterations in the structure and process will be apparent to those skilled in the art without departing from the scope of the present invention.

For example, while the above figures illustrate the incorporation of SiON DARC into formation of silicide contacts to the polysilicon gate of a MOS transistor device, the invention is not limited to formation of this structure. The process in accordance with the present invention could also be utilized during formation of silicided contacts to polysilicon components of other IC structures, such as the plates of a polysilicon-on-polysilicon capacitor.

Moreover, while the above discussion describes a process flow in which semiconductor material is implanted into the thin oxide formed at the DARC/polysilicon interface prior to silicide formation, this step is not required by the present invention.

To understand this, recall that once densified, the SiON DARC material contains a sufficiently high concentration of silicon (at least 55%) to react with a silicide-forming metal to form low resistance silicide contacts. Recall also that the sole purpose of implanting semiconducting material is to provide seed material for silicide that must be formed in the oxide layer underlying the DARC. Silicide formation in this thin oxide layer is required to provide a low resistance electrical pathway between the silicided gate contact and the gate polysilicon overlying the gate oxide.

The thin oxide beneath the DARC is an unwanted by-product of the seal oxidation/DARC densification step. Therefore, where no thin oxide layer is formed beneath the densified DARC during the process flow, no semiconductor implant step is required.

Figure 5A:
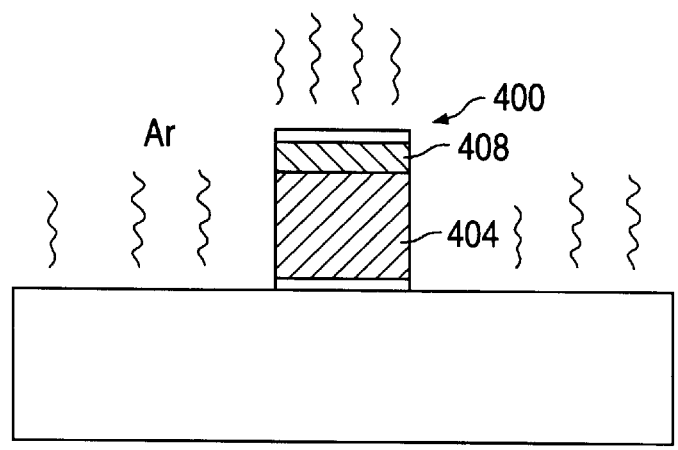
FIGS. 5A–5B show cross-sectional views of a portion of a process flow for forming a polysilicon gate structure incorporating DARC in accordance with an alternative embodiment of the present invention.

Therefore, an alternative embodiment of the present invention proposes densifying the DARC prior to exposing the DARC to an oxidizing ambient during seal oxide formation. FIG. 5A shows this step, wherein immediately prior to the seal oxide step, the DARC/polysilicon structure 400 is annealed in an inert ambient (such as an $N_2$ or Ar), thereby densifying DARC 408 without any accompanying formation of an underlying oxide layer. Alternatively, the SiON DARC could be densified by heating in an inert ambient immediately following its formation over the polysilicon, prior to patterning the photoresist and etching the polysilicon.

Figure 5B:
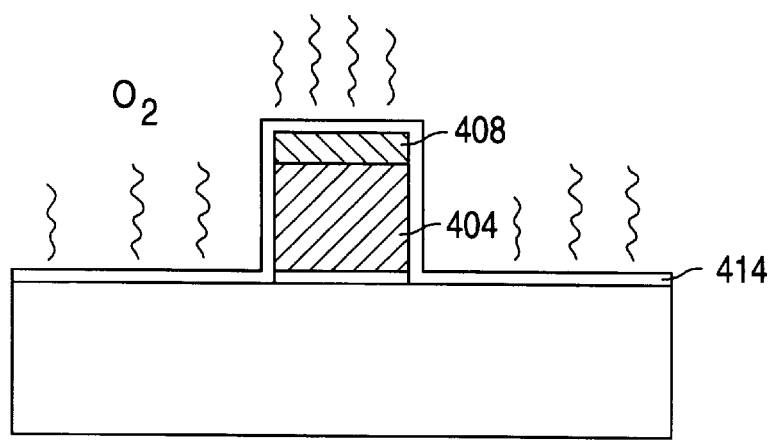

Densified DARC 408 serves as a barrier against diffusion of oxygen through DARC 408 into polysilicon 404, such that an underlying oxide layer is prevented from being formed during the subsequent thermal oxidation step forming seal oxide 414 as shown in FIG. 5B.

The alternative embodiment proposed above in connection with FIGS. 5A–5B is advantageous insofar as the extra step of implanting semiconductor material is eliminated. However, in practical terms, it is difficult to effectively prevent oxygen from penetrating through the DARC and forming a thin oxide layer beneath the DARC during seal oxidation. For this reason, the preferred embodiment includes the step of ion-implanting Si or Ge in order to eliminate the adverse effects on electrical conductivity posed by formation of the underlying thin oxide.

Yet another alternative embodiment of the present invention dispenses entirely with the step of thermal densification of DARC prior to silicide formation. Certain processes form oxide at low temperatures (300–600° C.) utilizing chemical vapor deposition (CVD) techniques. Where such a process is utilized to form the seal oxide layer, the DARC may still be sufficiently enriched in semiconductor material to permit the subsequent formation of silicide, without resorting to annealing in an inert ambient as described above in connection with the alternative embodiment shown in FIGS. 5A–5B.

Specifically, the semiconductor implantation step may be modified to implant semiconductor material directly into the DARC itself, rather than into the underlying thin oxide layer. This modified implant step should raise the semiconductor content of the DARC to above 55% in order to ensure subsequent formation of silicide.

Where such a modified semiconductor implant step is performed, reduced implant doses and energies should be employed in comparison with an implant targeting an underlying thin oxide layer. Lower energies should be employed to ensure that peak semiconductor doping occurs in the DARC rather than in the underlying material. Lower doses should be employed because the native silicon content of the DARC is higher than the native silicon content of the thin oxide layer.

Moreover, even when the lower temperature CVD oxide deposition techniques are employed to form the seal oxide, oxygen may still diffuse through the DARC to form a thin oxide layer between DARC and polysilicon. Under these circumstances, the semiconductor implant step should be performed after seal oxide formation under conditions ensuring that the thin oxide layer, as well as the DARC, are sufficiently enriched in semiconductor material to create a low resistance contact.

Given the above description and the variety of embodiments disclosed therein, it is intended that the following claims define the scope of the present invention, and that processes within the scope of these claims and their equivalents be covered hereby.

What is claimed is:

1. A process for forming a silicide contact to a polysilicon feature, the process comprising the steps of:

forming a polysilicon layer;

forming a layer of dielectric anti-reflective coating (DARC) over the polysilicon layer, the DARC having a semiconductor content;

patterning a photoresist mask over the DARC;

etching the DARC and the polysilicon layer in unmasked regions;

modifying the DARC to enhance its semiconductor content; and exposing the modified DARC to a silicide-forming metal such that the DARC is converted into silicide.

2. The process according to claim 1 wherein the step of forming the DARC comprises forming a layer of silicon oxynitride.

3. The process according to claim 2 wherein the step of modifying the DARC to enhance its semiconductor content comprises heating the DARC in an inert ambient to densify the DARC prior to exposure of the DARC to oxidizing conditions.

4. The process according to claim 3 wherein the step of heating the DARC comprises heating the DARC to between about 700–1000° C. in an ambient selected from the group consisting of nitrogen and argon.

5. The process according to claim 2 further comprising the step of thermally forming a seal oxide layer over the polysilicon layer, wherein the step of modifying the DARC to enhance its semiconductor content comprises densifying the DARC coincident with thermal formation of the seal oxide layer.

6. The process according to claim 5 wherein during the step of seal oxide formation oxygen diffuses through the DARC and reacts with the polysilicon to form a oxide layer between the DARC and the polysilicon, the process further comprising the step of introducing semiconductor material into the oxide layer such that silicide forms in the thin oxide layer upon exposure to the silicide-forming metal.

7. The process according to claim 6 wherein the step of introducing semiconductor material comprises ion-implanting a semiconductor material such that the concentration of semiconductor material in the oxide layer is at least about 55%.

8. The process according to claim 7 wherein the step of ion-implanting a semiconductor comprises ion-implanting at least one of silicon and germanium.

9. The process according to claim 2 further comprising the step of forming a seal oxide layer over the polysilicon layer, and wherein the step of modifying the DARC to enhance its semiconductor content comprises ion implanting semiconductor material into the DARC.

10. The process according to claim 9 wherein the step of ion implanting semiconductor material into the DARC comprises ion-implanting a semiconductor material such that its semiconductor content is at least about 55%.

11. The process according to claim 10 wherein the step of ion-implanting a semiconductor comprises ion-implanting at least one of silicon and germanium.

12. The process according to claim 9 wherein during the step of seal oxide formation oxygen diffuses through the DARC and reacts with the polysilicon to form a thin oxide layer between the DARC and the polysilicon, the process further comprising the step of introducing semiconductor material into the oxide layer such that silicide forms in the oxide layer upon exposure to the silicide-forming metal.

13. The process according to claim 12 wherein the step of introducing semiconductor material comprises ion-implanting a semiconductor material such that the concentration of semiconductor material in the oxide layer is at least about 55%.

14. The process according to claim 13 wherein the step of ion-implanting a semiconductor comprises ion-implanting at least one of silicon and germanium.

15. The process according to claim 1 wherein the step of etching the DARC and the polysilicon layer produces an electrode of a polysilicon-on-polysilicon capacitor structure.

16. The process according to claim 1 further comprising the steps of:

forming a gate oxide layer over a semiconductor workpiece; and forming the polysilicon layer over the gate oxide layer, whereby the step of etching the DARC and the polysilicon layer produces a precursor gate structure of a MOS transistor.

17. A method for forming a silicided contact upon polysilicon feature comprising the steps of:

patterning a polysilicon feature from a polysilicon layer bearing a dielectric anti-reflective coating (DARC) having a semiconductor content;

modifying the DARC to enhance its semiconductor content; and annealing the modified DARC while in contact with a silicide-forming metal to form a silicide.

18. The method according to claim 17 wherein the step of modifying the DARC comprises heating the DARC in an inert ambient prior to exposure to oxidizing conditions.

19. The method according to claim 18 wherein the step of modifying the DARC comprises ion implanting semiconductor material into the DARC.

20. The method according to claim 18 wherein the step of modifying the DARC comprises annealing the DARC during thermal formation of a seal oxide layer.

* * * * *